United States Patent
Vice

(10) Patent No.: US 7,619,463 B2
(45) Date of Patent: Nov. 17, 2009

(54) POWER DOWN CIRCUIT

(75) Inventor: Michael W. Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 573 days.

(21) Appl. No.: 11/060,018

(22) Filed: Feb. 17, 2005

(65) Prior Publication Data

US 2006/0181830 A1    Aug. 17, 2006

(51) Int. Cl.
*G11C 5/14* (2006.01)
(52) U.S. Cl. .................................. 327/530; 327/535
(58) Field of Classification Search ................. None
See application file for complete search history.

(56) References Cited

U.S. PATENT DOCUMENTS

| | | | | |
|---|---|---|---|---|
| 4,384,220 A | * | 5/1983 | Segawa et al. | 326/120 |
| 4,639,661 A | * | 1/1987 | Williams et al. | 323/317 |
| 5,619,164 A | * | 4/1997 | Tomishima | 327/541 |
| 6,225,855 B1 | * | 5/2001 | Taguchi | 327/538 |
| 2002/0190779 A1 | * | 12/2002 | Aiba et al. | 327/530 |
| 2005/0083101 A1 | * | 4/2005 | Aoike | 327/333 |
| 2005/0134334 A1 | * | 6/2005 | Mikyska | 327/143 |

* cited by examiner

*Primary Examiner*—Lincoln Donovan
*Assistant Examiner*—Khareem E. Almo

(57) ABSTRACT

A power down circuit that provides an on-state electrical current to a load circuit that does not depend significantly on power control signal logic levels and that provides a widened off-state control signal voltage range. A power down circuit according to the present teachings includes a switching transistor for providing an electrical current to a load circuit in an on-state and for interrupting the electrical current in an off-state and that includes a circuit for operating the switching transistor in a triode region during the on-state.

11 Claims, 2 Drawing Sheets

POWER DOWN CIRCUIT

BACKGROUND

A wide variety electronic circuits including integrated circuits may include a power down circuit. For example, a power down circuit may be used to remove electrical power from an electronic circuit when it is not in use. A power down circuit may be useful for extending battery life in a system as well as for temperature control in a system.

A power down circuit may employ a switching transistor having a common-drain configuration in which a load circuit is coupled to the source of the switching transistor. A power control signal having two possible logic states may be applied to the gate of the switching transistor to control the on/off states of the load circuit. For example, a high logic level of the power control signal may cause a high voltage level at the source of the switching transistor, thereby powering on the load circuit whereas a low logic level of the power control signal may cause a low voltage level at the source of the switching transistor, thereby powering off the load circuit A power down circuit that employs a switching transistor having a common-drain configuration may have a negative impact on the desired operation of a load circuit. For example, the magnitude of the voltage at the source of a switching transistor having a common-drain configuration depends on the magnitude of the voltage applied to the gate of the switching transistor because it operates as a source follower. As a consequence, the amount of voltage supplied to a load circuit in the power on state depends on the voltage level of the high logic state of the power control signal. Unfortunately, the voltage level of the high logic state may vary significantly in digital circuitry and the variation may cause variation in the operation of a load circuit. For example, the gain of an amplifier in a load circuit may vary in response to variation in its supply voltage. In addition, a variation in the voltage level of the low logic state of the power control signal may prevent a power down circuit from switching completely off.

One prior method for reducing the dependence of a power down circuit on the logic states of a power control signal is to amplify the power control signal before it is applied to the switching transistor. Unfortunately, an amplifier for the power control signal may consume electrical power in the off state, thereby defeating the purpose of a power down circuit.

SUMMARY OF THE INVENTION

A power down circuit is disclosed that provides an on-state electrical current to a load circuit that does not depend significantly on power control signal logic levels and that provides a widened off-state control signal voltage range. A power down circuit according to the present teachings includes a switching transistor for providing an electrical current to a load circuit in an on-state and for interrupting the electrical current in an off-state and that includes a circuit for operating the switching transistor in a triode region during the on-state. The configuration of the switching transistor provides a very small on-state resistance and an extremely large off-state resistance.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
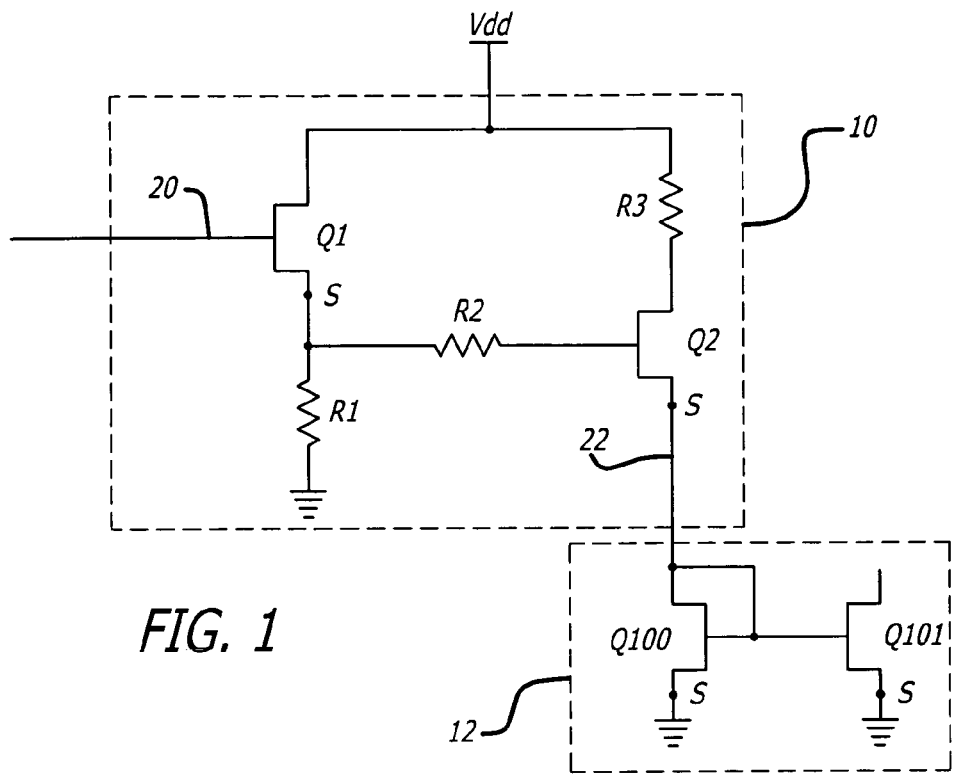
FIG. 1 shows a power down circuit according to the present teachings.

FIG. 1 shows a power down circuit 10 for a load circuit 12 according to the present teachings. The power down circuit 10 transitions between an on-state and an off-state in response to a power control signal applied at a input node 20.

The power down circuit 10 includes a switching transistor Q2 for providing an electrical current to the load circuit 12 in the on-state and for interrupting the electrical current in the off-state. In one embodiment, the power down circuit 10 operates from a voltage source Vdd and includes a resistor R3 that provides a source of the electrical current to be supplied to the load circuit 12. The power down circuit 10 includes circuitry for operating the switching transistor Q2 in its triode region during the on-state, thereby providing a very small on-state resistance and an extremely large off-state resistance. The power down circuit 10 also includes circuitry for increasing a threshold voltage at the input node 20 for transitioning from the off-state to the on-state.

The load circuit 12 in the example embodiment shown includes a transistor Q101 that represents an amplifier function and a transistor Q100 that is configured as a current mirror for supplying electrical current to the transistor Q101. The example shown for the load circuit 12 represents only one possible circuit that may be power controlled using the present techniques. A wide variety of electrical circuits may be controlled using the present techniques.

The switching transistor Q2 interrupts the flow of electrical current from the voltage source Vdd to the load circuit 12 in the off-state of the power down circuit 10. In the on-state of the power down circuit 10, the value of the resistor R3 determines the amount of electrical current supplied to the load circuit 12. The resistor R3 functions as a current mirror reference resistor that sets the electrical current in the transistor Q2 which is mirrored into the transistor Q101.

The circuitry in the power down circuit 10 is selected and arranged so that the switching transistor Q2 has a very small on resistance and a virtually infinite off resistance. The on-state or off-state of the power down circuit 10 is indicated in the voltage at a node 22 which is the source of the switching transistor Q2. The transistor Q1 is configured as a source follower so that when a power control signal applied at the input node 20 goes high, the source of the transistor Q1 goes high. The source of the transistor Q2 cannot exceed about 0.5 volts, in one embodiment, because it is coupled to the gate of the transistor Q100 at the node 22 and the source of the transistor Q100 is coupled to ground.

The resistor R2 is a gate bias resistor for the switching transistor Q2. The resistor R2 is relatively large compared with the resistor R3. As a consequence, the resistor R2 cannot add significantly to the electrical current in the source of the switching transistor Q2. Therefore, the switching transistor Q2 has a wide on state saturation region. The resistor R3 limits the electrical current into the transistor Q100 and ensures that the drain to gate voltage of the transistor Q100 does not rise above about 0.5 volts, in one embodiment.

The transistor Q1 functions as a buffer to provide a very high input impedance at the input node 20. When the switching transistor Q2 is biased in the on-state, its drain drops to a voltage of about 0.5 volts in one embodiment. The source of the switching transistor Q2 also attains a voltage of about 0.5 volts. As long as the source of the transistor Q1 is at least 1 volt, in one embodiment, no further increase in the voltage at the source of the transistor Q1 has an effect on the state of the switching transistor Q2. Instead, the switching transistor Q2 remains in its triode region where it has a relatively low on resistance. The result is a wide on-state logic defined voltage range within which the switching transistor Q2 is on and electrical current through the switching transistor Q2 is relatively constant. The transistor Q1 provides a wider off-state logic defined voltage range because its threshold voltage adds to the threshold voltage of the switching transistor Q2.

The resistor R1 pulls down the voltage at the source of the transistor Q1 to ground when it is off which in turn switches off the switching transistor Q2. The resistor R1 is selected to be large enough so that minimal electrical current is wasted in the on-state.

Figure 2:
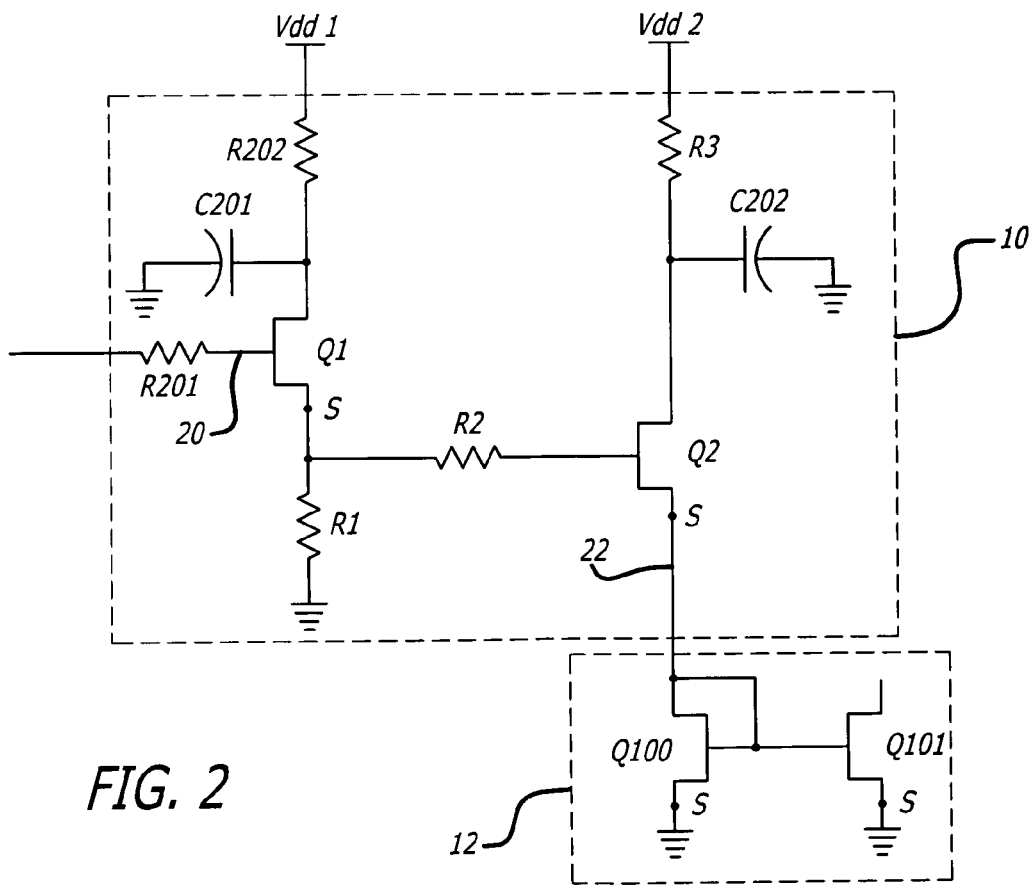
FIG. 2 shows another embodiment of a power down circuit according to the present teachings.

FIG. 2 shows the power down circuit 10 in another embodiment. In this embodiment, the power down circuit 10 includes a resistor R201 for limiting an excessive electrical current at the input node 20. An excessive electrical current at the input node 20 may be caused, for example, by electrostatic discharge.

The power down circuit 10 in this embodiment also includes a resistor R202 and a capacitor C201 that are useful for embodiments in which a Vdd1 voltage supply is taken from an output of an amplifier. A voltage supply may be taken from an output of an amplifier when, for example, it is desirable to consolidate I/O pins on an integrated circuit chip package. The resistor R202 and the capacitor C201 function as a low pass filter to prevent AC energy from impacting the operation of the power down circuit 10. Similarly, a capacitor C202 together with the resistor R3 provides low pass filtering when a Vdd2 voltage supply is taken from an output of an amplifier.

Figure 3:
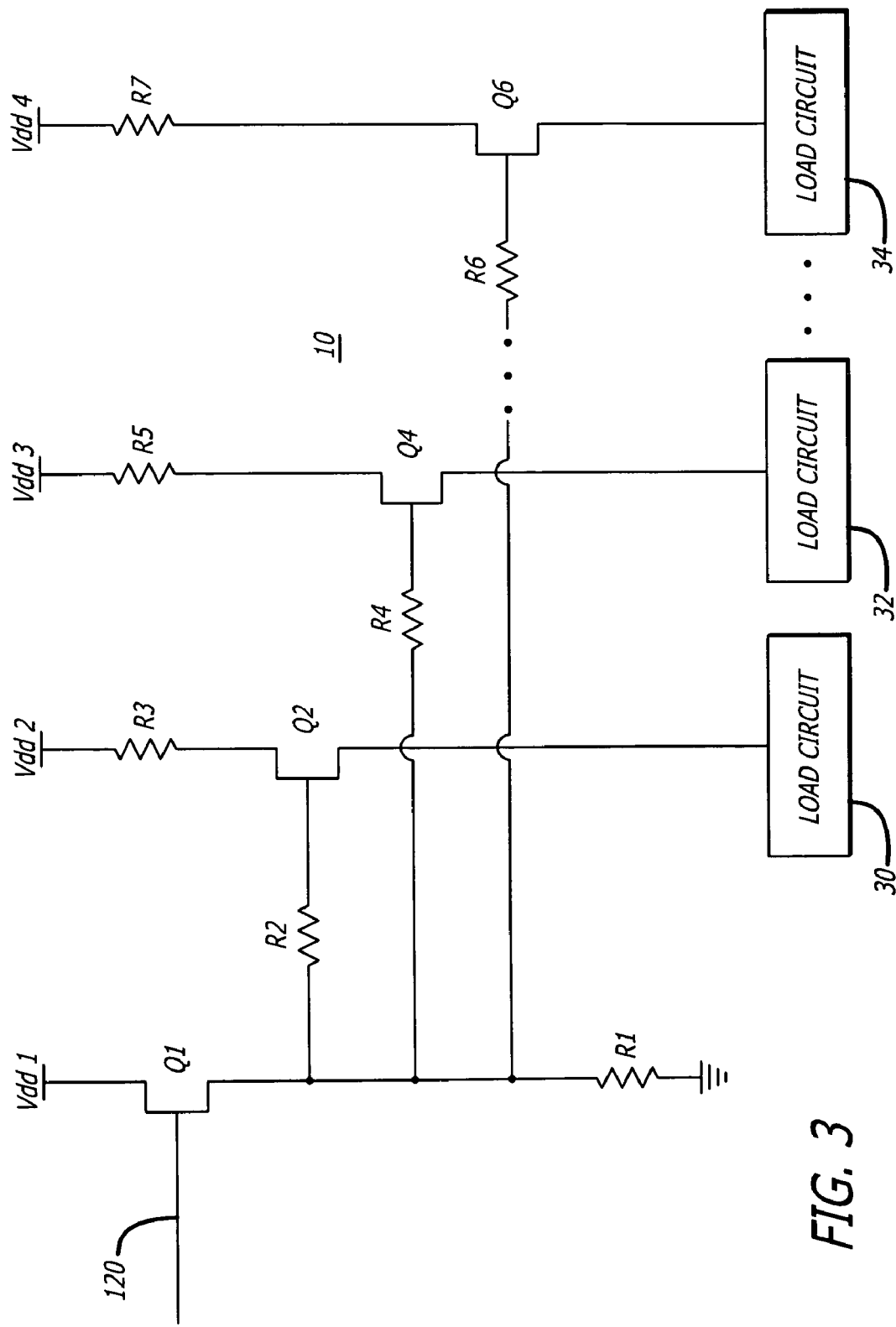
FIG. 3 shows an embodiment of a power down circuit that provides power control for multiple load circuits.

FIG. 3 shows an embodiment of the power down circuit 10 that provides power control for a set of load circuits 30-34. The load circuits 30-34 may include any number of load circuits. The switching transistor Q2 switches on/off electrical current flow for the load circuit 30 and a set of switching transistors Q4 and Q6 switch on/off electrical current flow for the load circuits 32-34, respectively. The resistors R4 and R6 perform functions similar to the resistor R2 for the respective switching transistor Q4 and Q6. The input node 120 may include a current limiting resistor and low pass filters may be included to block AC current as previously described.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An electronic circuit, comprising:
a load circuit that includes a first transistor and a second transistor coupled together in a current mirror configuration whereby a first current flowing through the first transistor is mirrored by a second current flowing through the second transistor, and wherein the first transistor has a drain terminal of the first transistor directly coupled to a gate terminal of the first transistor; and
a power down circuit comprising:
a third transistor configured as a switch located between a supply voltage and the first transistor, the switch configuration comprising a source terminal of the third transistor directly coupled to the drain terminal of the first transistor, and a gate terminal of the third transistor directly coupled to a first end of a first resistor for operating exclusively in a switching mode consisting of a) an on-state of the third transistor whereby the first transistor is connected to the supply voltage or b) an off-state of the third transistor whereby the first transistor is disconnected from the supply voltage thereby powering down the load circuit; and
a fourth transistor that is coupled to the third transistor through the first resistor, the fourth transistor configured as a source follower for driving the third transistor into one of the on state or the off state.

2. The electronic circuit of claim 1, wherein the current mirror configuration comprises the gate terminal of the first transistor directly coupled to a gate terminal of the second transistor, and a source terminal of the second transistor directly coupled to ground.

3. The electronic circuit of claim 1, wherein the fourth transistor is configured as a source follower by coupling a drain terminal of the fourth transistor to the supply voltage, and a source terminal of the fourth transistor to ground through a pull-down resistor.

4. The electronic circuit of claim 3, wherein the source terminal of the fourth transistor is further coupled to a second end of the first resistor for driving the third transistor into the one of the on state or the off state, wherein the second end of the resistor is different than the first end.

5. The electronic circuit of claim 4, wherein a gate terminal of the fourth transistor is configured to receive a power control signal for powering down the load circuit.

6. The electronic circuit of claim 1, wherein the fourth transistor is configured as a source follower by coupling a drain terminal of the fourth transistor to the supply voltage through a pull-up resistor, and a source terminal of the fourth transistor to ground through a pull-down resistor.

7. The electronic circuit of claim 6, further comprising a low pass filter, the low pass filter including a capacitor that is coupled to the pull-up resistor.

8. An electronic circuit, comprising:
a first load circuit comprising a first transistor and a second transistor coupled together in a first current mirror configuration whereby a first current flowing through the first transistor is mirrored by a second current flowing through the second transistor, wherein the first transistor has a drain terminal of the first transistor directly coupled to a gate terminal of the first transistor;
a second load circuit; and
a power down circuit comprising:
a third transistor configured as a source follower by coupling a drain terminal of the third transistor to the supply voltage and by coupling a source terminal of the third transistor to ground through a pull-down resistor;
a fourth transistor configured as a first switch, wherein a gate terminal of the fourth transistor is coupled to the source terminal of the third transistor through a first resistor, and wherein a drain terminal of the fourth transistor is coupled to the first load circuit; and
a fifth transistor configured as a second switch, wherein a gate terminal of the fifth transistor is coupled to the source terminal of the third transistor through a second resistor, and wherein a drain terminal of the fifth transistor is coupled to the second load circuit.

9. The electronic circuit of claim 8, wherein the first switch comprises a source terminal of the fourth transistor directly coupled to the drain terminal of the first transistor, and a gate terminal of the fourth transistor coupled to a first end of the first resistor.

10. The electronic circuit of claim 8, wherein the second load circuit comprises:
a sixth transistor and a seventh transistor coupled together in a second current mirror configuration whereby a third current flowing through the sixth transistor is mirrored by a fourth current flowing through the seventh transistor, wherein the sixth transistor has a drain terminal of the sixth transistor to a gate terminal of the sixth transistor.

11. The electronic circuit of claim 10, wherein the second switch comprises a source terminal of the fifth transistor directly coupled to the drain terminal of the sixth transistor, and a gate terminal of the fifth transistor coupled to a first end of the second resistor.

* * * * *